S006921980B2

(12) United States Patent
Nakanishi et al.

(10) Patent No.: US 6,921,980 B2
(45) Date of Patent: Jul. 26, 2005

(54) INTEGRATED SEMICONDUCTOR CIRCUIT INCLUDING ELECTRONIC COMPONENT CONNECTED BETWEEN DIFFERENT COMPONENT CONNECTION PORTIONS

(75) Inventors: Hiroyuki Nakanishi, Kitakatsuragi-gun (JP); Toshiya Ishio, Nabari (JP); Katsunobu Mori, Nara (JP)

(73) Assignee: Sharp Kabushiki Kaisha, Osaka (JP)

( * ) Notice: Subject to any disclaimer, the term of this patent is extended or adjusted under 35 U.S.C. 154(b) by 76 days.

(21) Appl. No.: 10/059,113

(22) Filed: Jan. 31, 2002

(65) Prior Publication Data

US 2002/0113323 A1 Aug. 22, 2002

(30) Foreign Application Priority Data

Feb. 16, 2001 (JP) ........................................ 2001-040302

(51) Int. Cl.[7] .................. H01L 25/00; H01L 23/48; H01L 29/40
(52) U.S. Cl. .................. 257/784; 257/777; 257/778; 257/686; 257/685; 257/723; 257/690; 257/691; 257/698; 257/737; 257/738; 257/786
(58) Field of Search .................. 257/784, 777, 257/723, 686, 685, 696, 690–693, 698, 737, 734, 738, 778, 786

(56) References Cited

U.S. PATENT DOCUMENTS

| | | | | |
|---|---|---|---|---|
| 5,209,817 A | * | 5/1993 | Ahmad et al. | 216/18 |
| 5,407,864 A | * | 4/1995 | Kim | 29/834 |
| 5,817,541 A | * | 10/1998 | Averkiou et al. | 438/107 |
| 5,834,844 A | * | 11/1998 | Akagawa et al. | 257/734 |
| 6,002,178 A | * | 12/1999 | Lin | 257/778 |
| 6,181,569 B1 | * | 1/2001 | Chakravorty | 361/761 |
| 6,187,680 B1 | * | 2/2001 | Costrini et al. | 438/688 |
| 6,200,888 B1 | * | 3/2001 | Ito et al. | 438/597 |
| 6,287,893 B1 | * | 9/2001 | Elenius et al. | 438/108 |
| 6,316,830 B1 | * | 11/2001 | Lin | 257/737 |
| 6,350,632 B1 | * | 2/2002 | Lin | 438/107 |
| 6,350,633 B1 | * | 2/2002 | Lin | 438/113 |
| 6,362,087 B1 | * | 3/2002 | Wang et al. | 438/597 |
| 6,365,501 B2 | * | 4/2002 | Farnworth | 438/614 |
| 6,479,900 B1 | * | 11/2002 | Shinogi et al. | 257/758 |
| 6,539,624 B1 | * | 4/2003 | Kung et al. | 29/843 |
| 6,590,291 B2 | * | 7/2003 | Akagawa | 257/774 |
| 6,627,824 B1 | * | 9/2003 | Lin | 174/268 |
| 6,653,217 B1 | * | 11/2003 | Lin | 438/612 |
| 2001/0023993 A1 | * | 9/2001 | Kawashima | 257/780 |
| 2001/0031548 A1 | * | 10/2001 | Elenius et al. | 438/613 |
| 2002/0011656 A1 | * | 1/2002 | Swanson et al. | 257/697 |
| 2002/0063340 A1 | * | 5/2002 | Sahara et al. | 257/773 |
| 2002/0227753 | * | 8/2002 | Lee et al. | 257/758 |
| 2002/0185721 A1 | * | 12/2002 | Hwang et al. | 257/678 |
| 2003/0062629 A1 | * | 4/2003 | Moden | 257/778 |
| 2003/0085466 A1 | * | 5/2003 | Akram et al. | 257/737 |
| 2003/0209806 A1 | * | 11/2003 | Akagawa | 257/758 |

FOREIGN PATENT DOCUMENTS

JP 05-021698 1/1993

* cited by examiner

*Primary Examiner*—Alexander Oscar Williams
(74) *Attorney, Agent, or Firm*—Nixon & Vanderhye P.C.

(57) ABSTRACT

An integrated semiconductor circuit includes a semiconductor chip on which surface a plurality of connection electrodes are formed, a lower insulating layer covering the surface of the semiconductor chip such that the connection electrodes are exposed, a plurality of wiring portions formed on the lower insulating layer, each of the wiring portions being connected to the connection electrode at one end and provided with a component connection portion at the other end, an upper insulating layer covering the wiring portions such that the component connection portions are exposed, and an electronic component connected between different component connection portions.

10 Claims, 10 Drawing Sheets

INTEGRATED SEMICONDUCTOR CIRCUIT INCLUDING ELECTRONIC COMPONENT CONNECTED BETWEEN DIFFERENT COMPONENT CONNECTION PORTIONS

CROSS-REFERENCE TO RELATED APPLICATION

This application is related to Japanese application No. 2001-40302 filed on Feb. 16, 2001, whose priority is claimed under 35 USC § 119, the disclosure of which is incorporated by reference in its entirety.

BACKGROUND OF THE INVENTION

1. Field of the Invention

The present invention relates to an integrated semiconductor circuit, and more particularly, it relates to an integrated semiconductor circuit mounted on or incorporated in electronic equipment.

2. Description of Related Art

In the field of small electronic equipment such as mobile phones, many attempts have been made for size reduction, improvement in function, increase in density and high density packaging of electronic components incorporated in such small electronic equipment. Further, for size reduction of the electronic equipment itself, research aims to provide electronic equipment with components of as small number as possible. Following the trend, a plurality of integrated semiconductor circuits (hereinafter referred to as IC), which have been packed independently, are accommodated in a single package.

For example, Japanese Unexamined Patent Publication No. Hei 5 (1993)-21698 describes a semiconductor device wherein a discrete component is fixed via adhesive onto conductive plates arranged on a semiconductor chip such that the discrete component and the semiconductor chip are packed together in a single package. The structure of this semiconductor device is shown in a plan view of FIG. 9(a) and a section of FIG. 9(b) taken along the line D—D shown in FIG. 9(a).

This semiconductor device has the following construction. An insulating layer 82 is formed on a semiconductor chip 81, two conductive plates 83 and 84 are formed thereon, and a discrete component 85 is fixed thereon via a conductive adhesive 86. Electrodes are electrically connected to lead terminals 87 and the thus provided semiconductor assembly is packed in a resin encapsulate 88, thereby a semiconductor package which can be contact mounted to a substrate is manufactured.

Figure 10:
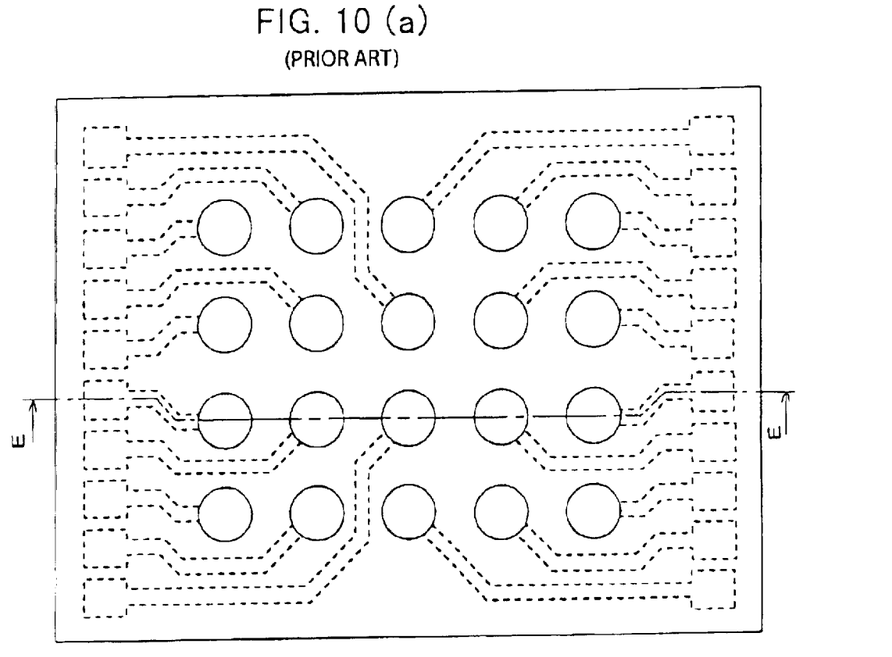
FIGS. 10(a) and 10(b) are views illustrating a conventional semiconductor device called as a chip size package.

FIGS. 10(a) and 10(b) show typically known small semiconductor device wherein a chip size package (CSP), i.e., a package having the same size as the semiconductor chip, is utilized. FIG. 10(b) is a section taken along the line E—E shown in FIG. 10(a).

The semiconductor device 91 shown in the FIGS. 10(a) and 10(b) has the following construction. A surface of a semiconductor chip 92 provided with a plurality of electrode pads 93 is covered with a first insulating layer 94 such that the electrode pads 93 are exposed and a plurality of wiring traces 95 are formed on the first insulating film 94, each of which being connected with the electrode pad 93 at one end and provided with an electrode pad 97 for mounting an external terminal at the other end. The wiring traces 95 are covered with a second insulating layer 96 such that the electrode pads 97 are exposed and external connection terminals 99 made of solder bumps are formed on the electrode pads 97.

However, the semiconductor device shown in FIGS. 9(a) and 9(b) involves difficulty in a process of adhering the insulating sheet 82 made of polyimide or the like which serves as an adhesive onto the semiconductor chip 81 to adhere thereto the conductive plates 83 and 84 made of Cu. That is, it is difficult to adhere a plate of 0.5×0.5 mm or smaller via the adhesive by mechanical movement, in particular to adhere a plurality of plates in a close positional relationship.

Figure 9:
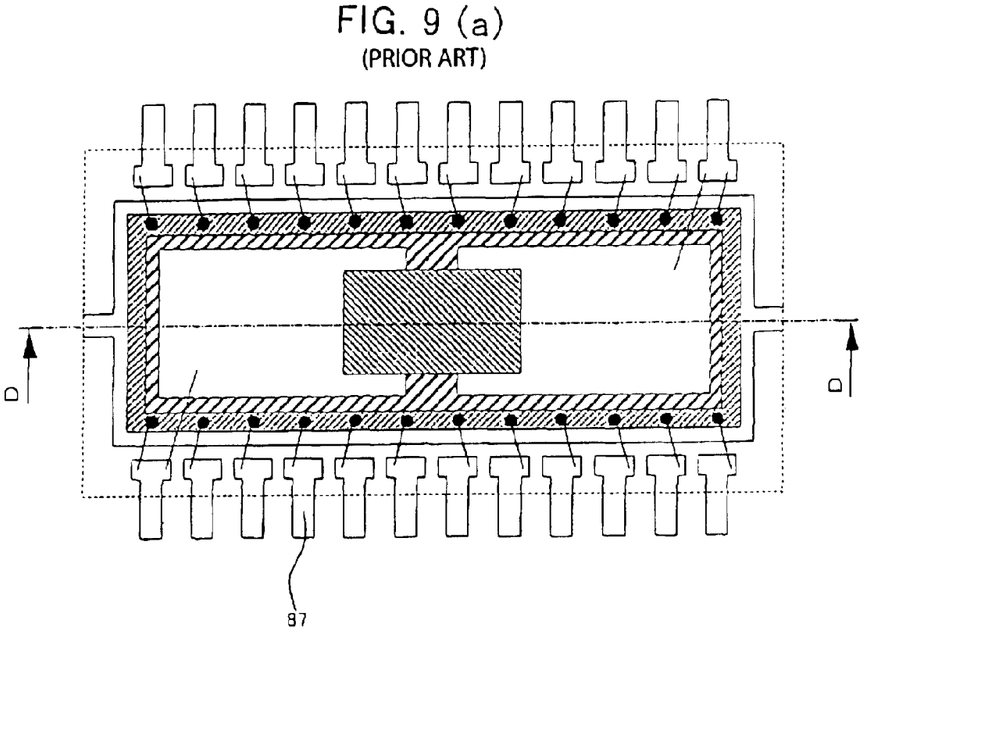
FIGS. 9(a) and 9(b) are views illustrating a conventional semiconductor chip and a discrete component packed in a single package.

For mounting a discrete component of 0.5×0.8 mm used in the small electronic equipment, only two conductive portions are sufficient in a region of 0.7×1.0 mm. However, in FIG. 9, two conductive plates 83 and 84 occupy 70–80% of the area of the semiconductor chip 81. It seems that such a large size of them will allow easy handling of the conductive plates 83 and 84 and reduction of the length of the wire for connecting with a ground electrode or a power source electrode.

SUMMARY OF THE INVENTION

In view of the above circumstances, the present invention provides an integrated semiconductor circuit wherein the number of components on a print circuit board is reduced by mounting a plurality of discrete electronic components on the semiconductor chip.

The present invention provides an integrated semiconductor circuit comprising: a semiconductor chip on which surface a plurality of connection electrodes are formed; a lower insulating layer covering the surface of the semiconductor chip such that the connection electrodes are exposed; a plurality of wiring portions formed on the lower insulating layer, each of the wiring portions being connected to the connection electrode at one end and provided with a component connection portion at the other end; an upper insulating layer covering the wiring portions such that the component connection portions are exposed; and an electronic component connected between different component connection portions.

According to the present invention, the wiring portions provided with the component connection portions are formed on the semiconductor chip surface and the electronic components are connected between different component connection portions. Therefore, the semiconductor chip together with the electronic components mounted thereon can be packed as a single integrated semiconductor circuit.

These and other objects of the present application will become more readily apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in, the art from this detailed description.

DESCRIPTION OF THE PREFERRED EMBODIMENTS

In the present invention, the semiconductor chip may be of any kind as long as a plurality of connection electrodes are formed on a surface thereof. The connection electrodes are generally referred to as electrode pads and are bonded with lead terminals via wires, respectively. For example, a common semiconductor chip obtained by forming integrated circuits on a semiconductor substrate (wafer) of a Group 14 (Group IV in Japanese style) semiconductor such as Si, a compound semiconductor or the like and dicing the wafer.

It is preferred that the lower and upper insulating layers are formed of an organic polymer in view of easiness of manufacture and costs. The organic polymer may be polyimide, for example. A photosensitive polymer may be used so that patterning for exposing the connection electrodes can be carried out. Alternatively, a non-photosensitive polymer may be formed and patterned by using a photosensitive resist.

The wiring portions are so-called wiring traces and include various kinds thereof formed by etching or electrolysis plating.

The electronic component is in general sense a discrete electronic component and connected between different component connection portions. The component connection portions are often plated with gold on their surfaces. The connection of the discrete electronic component between different component connection portions is achieved by providing solder paste on the component connection portions, placing the discrete electronic component thereon, followed by a reflow process in a reflow oven.

Hereinafter, embodiments of the present invention will be described with reference to FIGS. 1–8, but the invention is not limited thereto.

Embodiment 1

Figure 1:
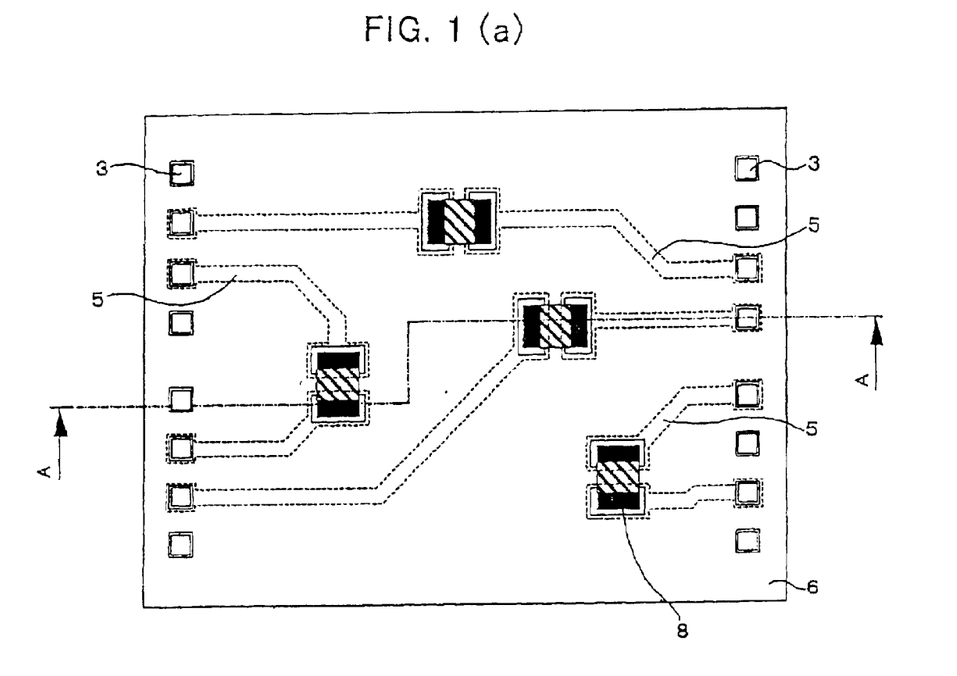
FIGS. 1(a) and 1(b) are views illustrating an integrated semiconductor circuit according to Embodiment 1 of the present invention.

FIGS. 1(a) and 1(b) illustrate an integrated semiconductor circuit according to Embodiment 1 of the present invention. FIG. 1(b) is a section taken along the line A—A shown in FIG. 1(a).

An integrated semiconductor circuit 1 comprises a semiconductor chip (may be referred to an IC chip) 2 provided with electrode pads (first connection portions) 3, a lower insulating film (lower insulating layer) 4, wiring traces (wiring portions) 5, an upper insulating film (upper insulating layer) 6, component connection terminals (second connection portions) 7 and discrete electronic components 8.

A plurality of electrode pads 3 are formed at the end portions of the semiconductor chip surface. The surface of the semiconductor chip 2 except the electrode pads 3 is covered with the lower insulating film 4. On the lower insulating film 4, a plurality of wiring traces 5 are formed. Each of the wiring traces 5 is connected to the electrode pad 3 at one end thereof and provided with a connection pad at the other end. On the connection pads, component connection terminals 7 made of solder are formed, respectively.

The wiring traces 5 are covered with the upper insulating film 6 except the connection pads on which the component connection terminals 7 are formed. The discrete electronic components 8 are connected between the component connection terminals 7 of different wiring traces 5.

Figure 2:
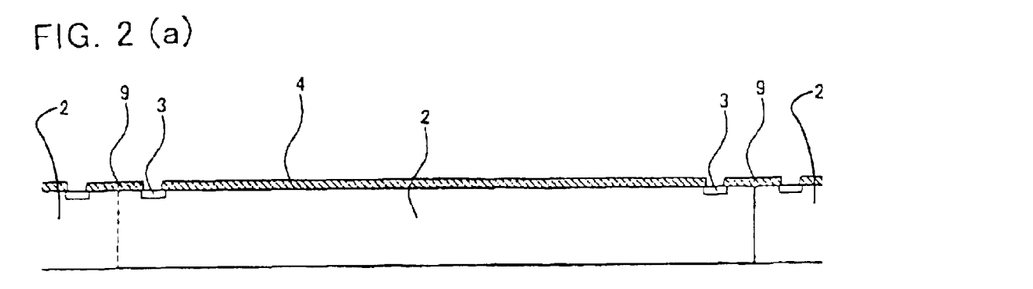
FIGS. 2(a) to 2(e) are views illustrating a process of manufacturing the integrated semiconductor circuit according to Embodiment 1.

FIGS. 2(a) and 2(e) show a process of manufacturing the integrated semiconductor circuit according to Embodiment 1. The manufacturing process will be described with reference to the figures.

Semiconductor chips 2 are mainly made of silicon (Si) and include integrated circuits inside, respectively. On the surfaces of the semiconductor chips 2, electrode pads 3 to which metal wires will be connected via bonding are formed.

First, the surfaces of the semiconductor chips 2 are covered with a lower insulating film 4 of 5 $\mu$m thick made of polyimide such that the electrode pads 3 are exposed (see FIG. 2(a)). Below the lower insulating film 4, an insulating film of $SiO_2$ or SiN has been formed (not shown).

Then, wiring traces 5 are formed by plating on the lower insulating film 4. The wiring traces 5 establish electrical conduction between the electrode pads 3 and the portions where discrete electronic components 8 will be mounted (see FIG. 2(b)).

The wiring traces 5 are formed by the following steps. First, on the lower insulating film 4 and the electrode pads 3, i.e., on the entire surfaces of the semiconductor chips 2, titanium tungsten (TiW) and copper (Cu) are deposited sequentially by sputtering to have a thickness of 0.1 $\mu$m, respectively. Then, a photosensitive resist of 10 $\mu$m thick is formed on the thus deposited copper, and then light exposure and development are carried out by using a mask to form grooves (not shown) in which the wiring traces 5 will be formed. Then, copper is deposited in the grooves in a thickness of 5 $\mu$m by electrolysis plating, the photosensitive resist is chemically peeled off, and the exposed films of TiW and Cu formed by sputtering are removed. Thus, the isolated wiring traces 5 of cupper are formed.

Then, on the wiring traces 5 and the lower insulating film 4, i.e., on the entire surfaces of the semiconductor chips 2, a photosensitive polymer of 10 $\mu$m thick is applied. This is subjected to light exposure and development through a mask such that portions where the discrete electronic components 8 will be mounted, i.e., where connection pads will be provided, are exposed. Thus, the upper insulating film 6 is formed (see FIG. 2(c)).

A non-photosensitive polymer and a photosensitive resist may be used in place of the photosensitive polymer. That is, the non-photosensitive polymer is applied first and the photosensitive resist is applied thereon and subjected to light exposure and development through a mask, thereby forming openings (connection pads) for connection with the discrete electronic components simultaneously in the photosensitive resist and the non-photosensitive polymer. The same structure as described above is obtained also in this manner.

Then, on the copper wiring traces 5 exposed such that the discrete electronic components 8 can be mounted, i.e., on the connection pads, nickel (Ni) of 3 $\mu$m thick and gold (Au) of 0.1 $\mu$m thick (not shown) are formed by non-electrolysis plating.

On the thus deposited Au, solder paste printing is carried out to form component connection terminals 7 (see FIG. 2(d)). Discrete electronic components 8 are placed on the component connection terminals 7 and subjected to a reflow process to fix the components 8 (see FIG. 2(e)).

In the last step of the process, the semiconductor chips 2 are diced at dicing positions 9 to obtain integrated semiconductor circuits 1. Thus, the semiconductor chips are diced after the discrete electronic components 8 are mounted on the semiconductor chips 2 fabricated in a wafer.

Figure 3:
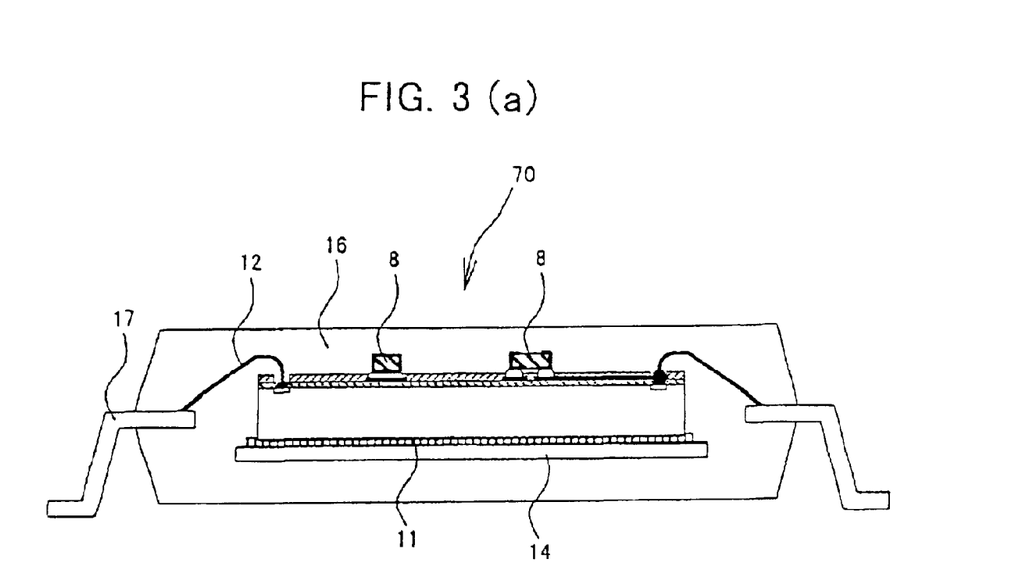
FIGS. 3(a) and 3(b) are views illustrating a package of the integrated semiconductor circuit manufactured by the manufacturing process of Embodiment 1.

FIGS. 3(a) and 3(b) show a package of the integrated semiconductor circuit 1 formed by the above-mentioned process. FIG. 3(a) illustrates an internal structure of a semiconductor package called TSOP (thin small outline package) and FIG. 3(b) illustrates an internal structure of a semiconductor package of CSP.

The integrated semiconductor circuit 1 fabricated by the above-mentioned process is resin-molded to form a semiconductor package 70 or a semiconductor package 71 showing the appearance completely identical to that of a conventional package.

In the semiconductor package 70 shown in FIG. 3(a), the semiconductor chip 2 on which the discrete electronic components 8 have been mounted is fixed onto a region called a die pad 14 with a die attachment member 11 such as silver paste. They are encapsulated in an epoxy resin 16 and the electrode pads are electrically connected with lead terminals 17 via wires 12, respectively.

In the semiconductor package 71 shown in FIG. 3(b), the size of the package is almost the same as that of the semiconductor chip. In this package, the semiconductor chip 2 on which the discrete electronic components 8 have been mounted is fixed onto a print circuit board 15 including insulative portions 15a and conductive portions 15b with a die attachment member 11 such as an insulating sheet of polyimide. They are encapsulated in an epoxy resin 16, the electrode pads are electrically connected with the conductive portions 15b via wires 12, respectively, and external connection terminals 19 are provided on a surface of the print circuit board 15 on which the semiconductor chip 2 is not mounted.

Embodiment 2

Figure 4:
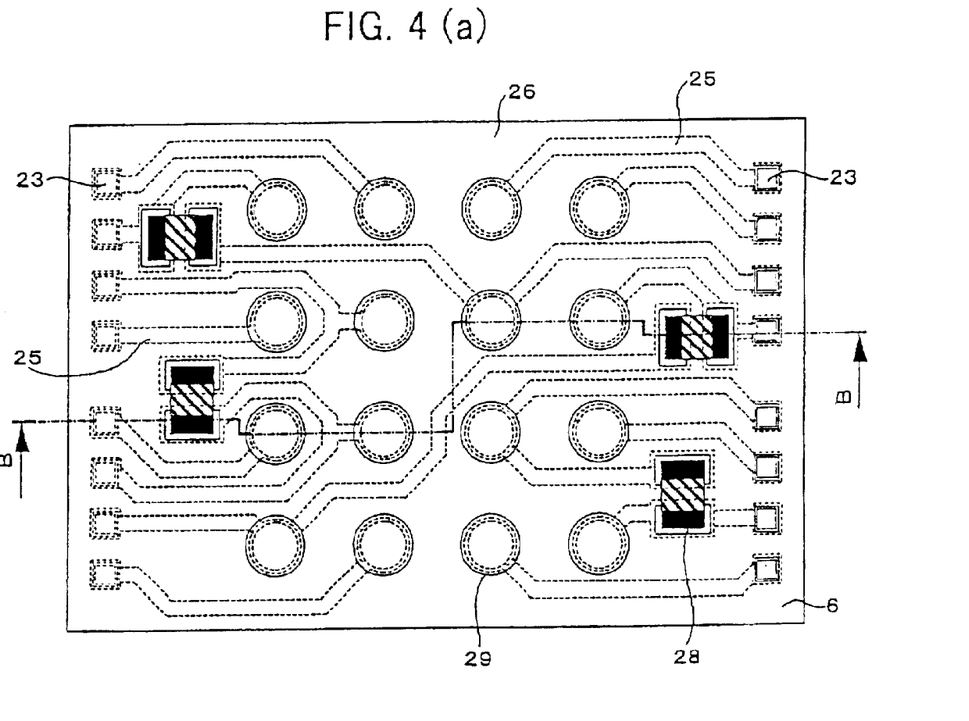
FIGS. 4(a) and 4(b) are views illustrating an integrated semiconductor circuit according to Embodiment 2 of the present invention.

FIGS. 4(a) and 4(b) show an integrated semiconductor circuit according to Embodiment 2 of the present invention. FIG. 4(b) is a section taken along the line B—B shown in FIG. 4(a). The integrated semiconductor circuit according to Embodiment 2 is a developed version of the semiconductor circuit of Embodiment 1.

In an integrated semiconductor circuit 72 according to the present embodiment, a surface of a semiconductor chip 22 on which electrode pads 23 are formed is faced downward. On this surface, a lower insulating film 24, wiring traces 25, an upper insulating film 26, component connection terminals 27 and external connection terminals 29 are formed. That is, connection pads and external connection pads are formed on the wiring traces 25. On the connection pads, the component connection terminals 27 are formed and discrete electronic components 28 are mounted thereon. On the external connection pads, the external connection terminals 29 made of solder bumps are formed.

The discrete electronic component 28 may be formed on the wiring trace 25 extending between the electrode pad 23 and the external connection terminal 29, on a junction of the wiring trace 25, or on the wiring trace 25 extending from the external connection terminal 29.

The region except the component connection terminals 27 and the external connection terminals 29 is covered with the upper insulating film 26 of 10 μm thick made of photosensitive polymer.

FIGS. 5(a) to 5(e) show a process of manufacturing the integrated semiconductor circuit according to Embodiment 2. Explanation of the process is given with reference to the figures.

Semiconductor chips 22 are the same as those of Embodiment 1. In the same manner as in Embodiment 1, the surfaces of the semiconductor chips 22 are covered with a lower insulating film 24 (see FIG. 5(a)).

Figure 5:
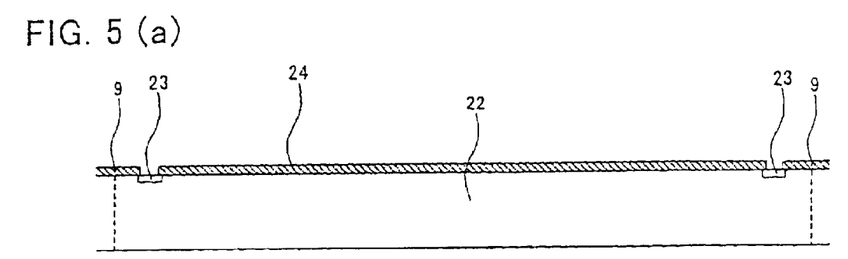
FIGS. 5(a) to 5(e) are views illustrating a process of manufacturing the integrated semiconductor circuit according to Embodiment 2.

Then, wiring traces 25 are formed on the lower insulating film 24 (see FIG. 5(b)), and then an upper insulating film 26 is formed on the surfaces of the semiconductor chips 22 except regions for forming connection pads and external connection pads (see FIG. 5(c)).

On the regions for forming the connection pads and the external connection pads, solder paste printing is carried out to form component connection terminals 27 for mounting discrete electronic components 28 and connection portions 27a for forming external connection terminals (see FIG. 5(d)).

Then, the discrete electronic components 28 are placed on the component connection terminals 27 and solder balls are placed on the connection portions 27a. They are subjected to a reflow process, thereby fixing the discrete electronic components 28 to the component connection terminals 27 and fabricate external connection terminals 29 made of solder bumps on the connection portions 27a (see FIG. 5(e)). Thus, the external connection terminals 29 are mounted simultaneously with the mounting of the discrete electronic components 28. Thereafter, the semiconductor chips are diced.

The process of the present embodiment is different from the process shown in FIGS. 2(a) to 2(e) in that the wiring traces 25 on the electrode pads 23 to which wires 12 will be connected are covered with the upper insulating film 26 and that the external connection terminals 29 are mounted.

Embodiment 3

FIGS. 6(a) and 6(b) show an integrated semiconductor circuit according to Embodiment 3 of the present invention. FIG. 6(b) is a section taken along the line C—C shown in FIG. 6(a). The integrated semiconductor circuit according to Embodiment 3 is also a developed version of the integrated semiconductor circuit of Embodiment 1.

In an integrated semiconductor circuit 41 according to the present embodiment, a semiconductor chip 42 including electrode pads 43 formed on its upper surface and a semiconductor chip 52 including electrode pads 53 formed on its lower surface are connected via flip-chip bonding.

On the upper surface of the semiconductor chip 42 where the electrode pads 43 are formed, a lower insulating film 44, wiring traces 45 and an upper insulating film 46 are formed in sequence. Each of the wiring traces 45 is connected to the electrode pad 43 at one end and provided with, at the other end, a component connection terminal 47 on which a discrete electronic component 48 will be mounted and a round pad for connection with a connection portion 59 made of a solder bump. The round pad 59 is formed at the edge or on the halfway of the wiring trace 45. The upper insulating film 46 is formed of a photosensitive polymer to have a thickness of 10 μm thick and covers the upper surface of the semiconductor chip 42 such that a part of the round pads is exposed.

On the lower surface of the semiconductor chip 52 where the electrode pads 53 are formed, a lower insulating film 54, wiring traces 55 and an upper insulating film 56 are formed in sequence. Each of the wiring traces 55 is connected with the electrode pad 53 at one end and provided with a round pad for connection with a connection portion 59 at the other end. The upper insulating film 56 is formed of a photosensitive polymer to have a thickness of 10 μm thick and covers the lower surface of the semiconductor chip 52 such that a part of the round pads is exposed.

The round pads on the upper surface of the semiconductor chip 42 and those on the lower surface of the semiconductor chip 52 are connected via the connection portions 59, respectively.

In the integrated semiconductor circuit 1 shown in FIGS. 6(a) and 6(b), the semiconductor chip 42, the semiconductor chip 52 and the discrete electronic components 48 are electrically and mutually connected via the wiring traces 45, the wiring traces 55 and the connection portions 59 at required positions.

Figure 6:
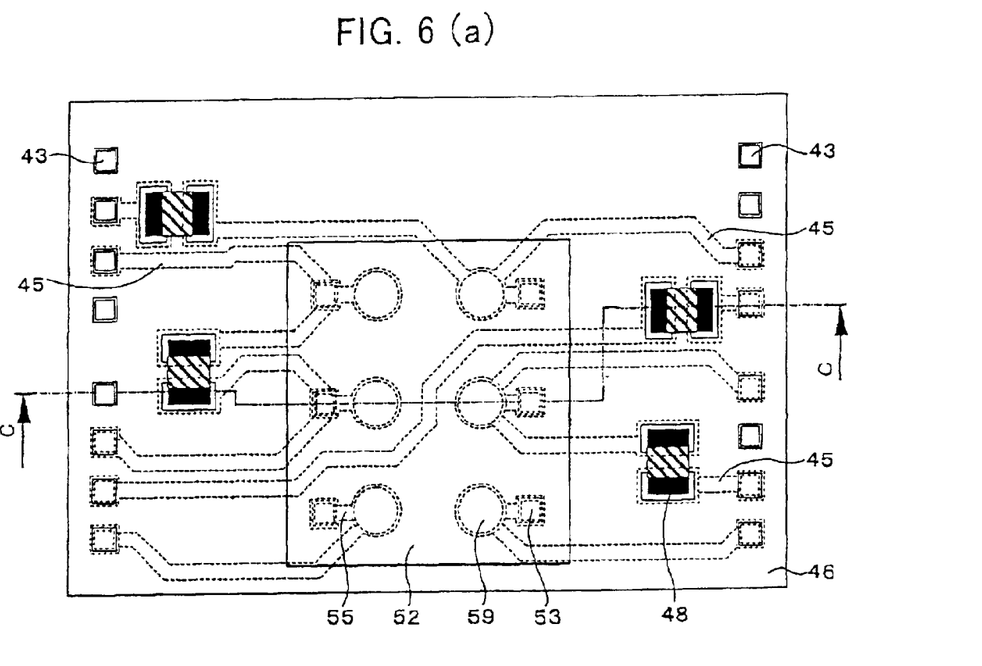
FIGS. 6(a) and 6(b) are views illustrating an integrated semiconductor circuit according to Embodiment 3.

Referring to FIGS. 6(*a*) and 6(*b*), all the electrode pads 53 on the semiconductor chip 52 are electrically connected with the electrode pads 43 on the semiconductor chip 42. However, connection pads exclusive to the semiconductor chip 52 may be formed on the semiconductor chip 42 as a part of the wiring traces 45.

Figure 7:
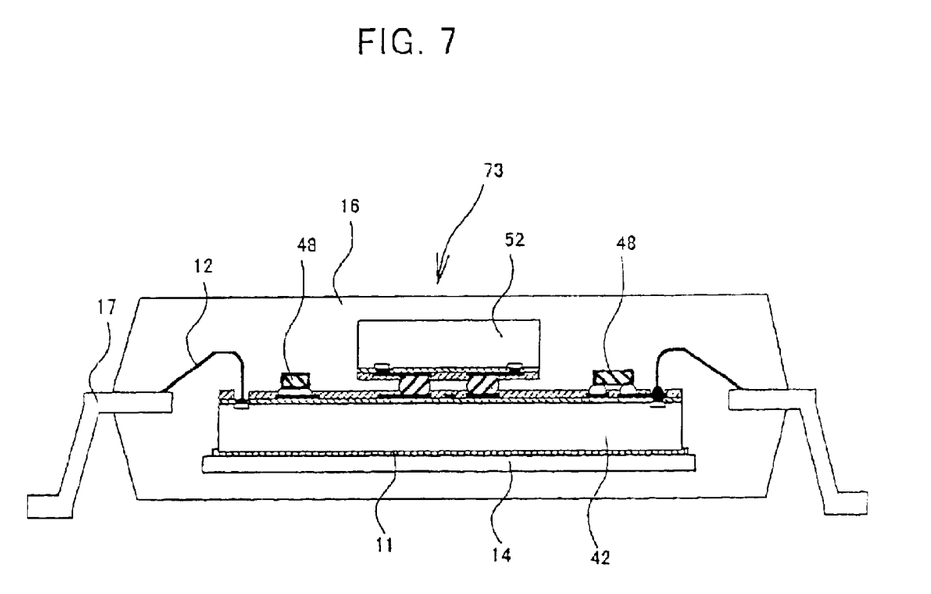
FIG. 7 is a view illustrating a package of the integrated semiconductor circuit according to Embodiment 3.

FIG. 7 illustrates a package of the above-mentioned integrated semiconductor circuit 41. The integrated semiconductor circuit 41 is incorporated in a package 73 as shown in FIG. 7.

Figure 8:
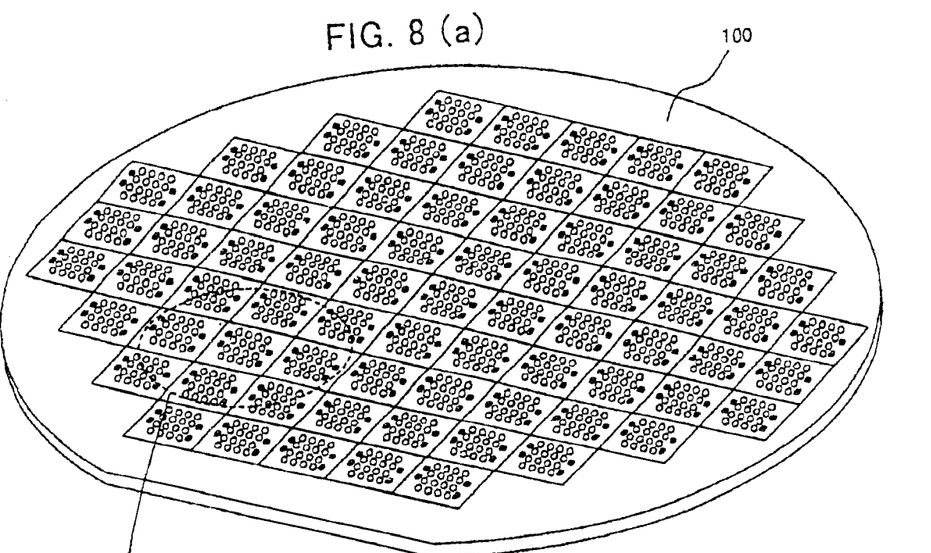
FIGS. 8(a) and 8(b) are views illustrating integrated semiconductor circuits on a wafer.

FIGS. 8(*a*) and 8(*b*) show integrated semiconductor circuits formed on a wafer. As shown in the figures, a number of integrated semiconductor circuits described above are fabricated on a wafer 100 and then diced into isolated chips.

As described above, a surface of the semiconductor chip on which a plurality of electrode pads have been formed is covered with a lower insulating film such that the electrode pads are exposed, a plurality of wiring traces are formed thereon and each of them are connected with the electrode pad at one end and provided with a component connection portion at the other end, the wiring traces are covered with an upper insulating film such that component connection portions are exposed, and discrete electronic components are connected between component connection portions of different wiring traces. Thus, small discrete electronic components of plural number are mounted on the semiconductor chip, thereby reducing the number of components on the print circuit board.

According to the present invention, the small discrete electronic components of plural number are formed on the semiconductor chip, which contributes to the reduction of the number of the components on the print circuit board.

What is claimed is:

1. An integrated semiconductor circuit comprising:
   a semiconductor chip comprising a surface on which a plurality of connection electrodes are formed;
   a lower insulating layer covering the surface of the semiconductor chip in a manner such that the connection electrodes are exposed;
   a plurality of wiring portions formed on the lower insulating layer, each of the wiring portions being connected to the connection electrode at one end and provided with a component connection portion at the other end;
   an upper insulating layer covering the wiring portions such that the component connection portions are exposed;
   an electronic component connected between different component connection portions;
   wherein a contact hole is defined in each of the lower and upper insulating layers at a location over at least one of the connection electrodes, so that the connection electrode is in electrical communication with an external terminal via said contact hole, with at least one conductor extending between the terminal and said contact hole; and
   wherein said external terminal is external of the chip so that the conductor extending between the external terminal and the contact hole extends through a resin which at least partially encapsulates the chip.

2. An integrated semiconductor circuit comprising an integrated semiconductor circuit according to claim 1 and another integrated semiconductor circuit connected therewith via flip-chip bonding.

3. An integrated semiconductor circuit according to claim 1 further comprising an external connection portion provided for the wiring portion in said contact hole, and wherein said terminal is an external connection terminal that is in electrical communication with the external connection portion of the wiring.

4. An integrated semiconductor circuit comprising an integrated semiconductor circuit according to claim 3, wherein the external connection terminal is connected with another integrated semiconductor circuit via flip-chip bonding.

5. An integrated semiconductor circuit device comprising an integrated semiconductor circuit according to claim 1 mounted on a die pad, wherein the connection electrode is connected with said terminal via a wire, and wherein the integrated semiconductor circuit, the die pad and the wire are encapsulated with a resin such that the terminal is partially exposed.

6. An integrated semiconductor circuit device comprising an integrated semiconductor circuit according to claim 1 mounted on a surface of a print circuit board comprising an insulating substrate and a conductive portion, wherein the connection electrode is connected with the conductive portion of the print circuit board via a wire, and wherein the integrated semiconductor circuit and the wire are encapsulated with a resin and the terminal is formed on an opposite surface of the print circuit board such that the terminal is electrically connected with the conductive portion.

7. An integrated semiconductor circuit comprising:
   a semiconductor chip having a surface on which plural electrode pads are formed, the chip being at least partially encapsulated with a resin;
   a lower insulating layer covering the surface of the semiconductor chip such that at least portions of the electrode pads are exposed;
   plural wiring traces formed on the lower insulating layer, at least some of the wiring traces having a first portion thereof connected to one of the electrode pads and having a corresponding one of plural component connection pads at a second portion thereof;
   an upper insulating layer covering the wiring traces such that the component connection pads are exposed;
   an electronic component connected between different component connection pads; and
   wherein a contact hole is defined in each of the lower and upper insulating layers at a location over at least one of the electrode pads, so that the electrode pad is in electrical communication with an external connection terminal via said contact hole, with at least one conductor extending through the resin between the external connection terminal and said contact hole.

8. An integrated semiconductor circuit comprising an integrated semiconductor circuit according to claim 7, wherein the upper insulating layer is a photosensitive polymer.

9. An integrated semiconductor circuit comprising an integrated semiconductor circuit according to claim 7, wherein the wiring traces comprise copper; wherein the electrode pads comprise Nickel and gold; and wherein the component connection pads comprise a solder paste.

10. An integrated semiconductor circuit device comprising an integrated semiconductor circuit according to claim 7 mounted on a die pad, wherein at least one of the electrode pads is connected with the external connection terminal via a wire, and wherein the die pad and the wire are encapsulated with a resin such that the terminal is partially exposed.

\* \* \* \* \*